United States Patent [19]

Tsuno et al.

[11] Patent Number: 4,468,563
[45] Date of Patent: Aug. 28, 1984

[54] ELECTRON LENS

[75] Inventors: Katsushige Tsuno; Katsuyoshi Ueno, both of Akishimashi, Japan

[73] Assignee: JEOL Ltd., Tokyo, Japan

[21] Appl. No.: 395,702

[22] Filed: Jul. 6, 1982

[30] Foreign Application Priority Data

Jul. 6, 1981 [JP] Japan ................... 56-105363

[51] Int. Cl.³ .......................................... H01J 37/00
[52] U.S. Cl. ............................................ 250/396 ML
[58] Field of Search ........... 250/311, 356 R, 396 ML, 250/358

[56] References Cited

U.S. PATENT DOCUMENTS 3,351,754 11/1967 Dietrich et al. ............. 250/396 ML
3,984,687 10/1976 Loeffler et al. ............. 250/396 ML

FOREIGN PATENT DOCUMENTS 1102327 2/1968 United Kingdom ........ 250/396 ML

Primary Examiner—Bruce C. Anderson
Attorney, Agent, or Firm—Webb, Burden, Robinson & Webb

[57] ABSTRACT

An electron lens equipped with a ferromagnetic body disposed in at least one of the pole gaps of the electron lens which serves as a switchable bypass for magnetic flux. The said ferromagnetic body is magnetically saturated under strong excitation, thereby permitting switching between the double-gap lens and the single-gap lens to be effected by changing the excitation current.

5 Claims, 8 Drawing Figures

ELECTRON LENS

BACKGROUND OF THE INVENTION

This invention relates to an electron beam condensing electron lens which is primarily used as an electron microscope illumination lens, wherein a single pole gap or a double pole gap can be selected as desired.

The remarkable progress of electron microscopy in recent years permits users to observe not only transmission images but also scanning images with the use of a single electron microscope. In such an electron microscope, it is necessary that the specimen be irradiated by a relatively broad beam, the elements of which are substantially parallel in order to obtain transmission images. On the other hand, a specimen must be irradiated by a very finely focused beam to obtain scanning images. To meet these requirements, it is customary to use, as an illumination lens system, a two-lens system to obtain transmission images, and a three-lens system to obtain scanning images.

FIG. 1 shows a ray diagram of an illumination lens system having a first condenser lens of single-gap construction. FIG. 2 illustrates a ray diagram of an illumination lens system having a first condenser lens of double-gap construction. Each of the illumination lens systems includes a first condenser lens 1, a second condenser lens 2, and an electron gun 3. Object 4 refers to the specimen to be observed. In each of the illumination lens systems shown in FIGS. 1 and 2, an electron beam emitted from the electron gun 3 is condensed by the first and second condenser lenses 1, 2; it then impinges on the specimen. However, the first condenser lens 1 of double-gap construction shown in FIG. 2 comprises two lenses, 1a and 1b.

FIG. 3 illustrates the relation between magnification |M| of the illumination lens system and the reciprocals of the focal length (1/f) of the first condenser lenses 1 of single-gap construction and double-gap construction (see FIGS. 1 and 2). Designated as S is a curve for the single-gap lens, and D (D1, D2, D3) is a curve for the double-gap lens. Since the reciprocal of the focal length (1/f) is proportional to the square $J^2$ of the excitation intensity J for the condenser lenses, the horizontal axis indicates $J^2$ as well as 1/f. The vertical axis indicates "dc" (beam spot size) as well as magnification, since the spot size/diameter of the electron beam, which impinges on the specimen, is the product of the magnification |M| and the size of the crossover of the electron beam source.

As is clear from FIG. 3, the spot size dc of the electron beam obtained by using the double-gap lens is much smaller than that obtained by using the single-gap lens at the same practical excitation intensity.

Therefore, the double-gap lens is preferable for observing scanning images generated by an electron beam having a smaller diameter.

On the other hand, it is known that the single-gap lens is preferable for observing transmission images formed by an electron beam having a larger diameter in order to obtain a parallel beam.

FIG. 4 shows a vertical cross-section of a conventional first condenser lens of double-gap configuration. The first condenser lens 1 as shown comprises a yoke 5, which defines a magnetic circuit, a pole piece 6 disposed in the magnetic circuit and having first and second gaps 6a, 6b, annular spacers 7a, 7b, of nonmagnetic material which define the first and second gaps 6a, 6b, respectively, and an excitation coil 8. The prior double-gap lens is disadvantageous in that conversion from double-gap construction into a single-gap configuration requires disassembly of the lens barrel and replacement of the lens itself, or the changing of some parts of the lens for replacement of the pole piece, a procedure which is quite time-consuming and laborious.

SUMMARY OF THE INVENTION

The object of the present invention is to provide the user with an electron lens that can be switched from a single-gap lens to a double-gap lens and vice versa without time-consuming and laborious mechanical operations.

Briefly, this invention incorporated an electron lens equipped with a ferromagnetic body which is disposed in at least one of the pole gaps of the electron lens and serves as a bypass for magnetic flux. The said ferromagnetic body is magnetically saturated under strong excitation, thereby permitting switching between the double-gap lens and single-gap lens to be effected by merely changing the excitation current.

DESCRIPTION OF THE PREFERRED EMBODIMENT

Figure 4:
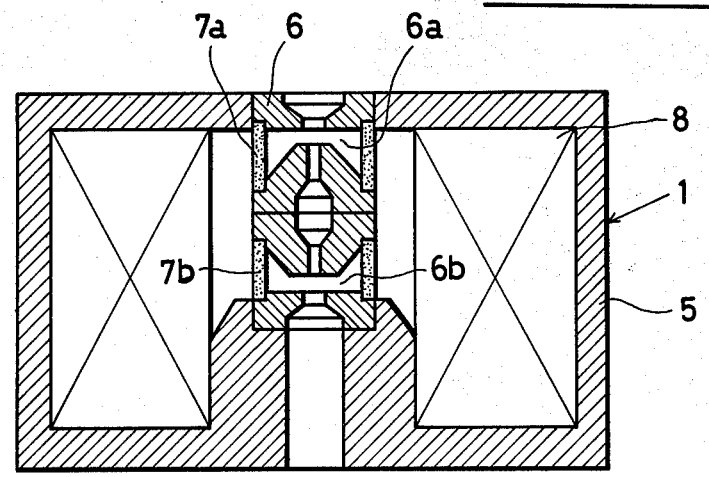
FIG. 4 illustrates a vertical cross-section of a conventional first condenser lens of double-gap construction.
Figure 3:
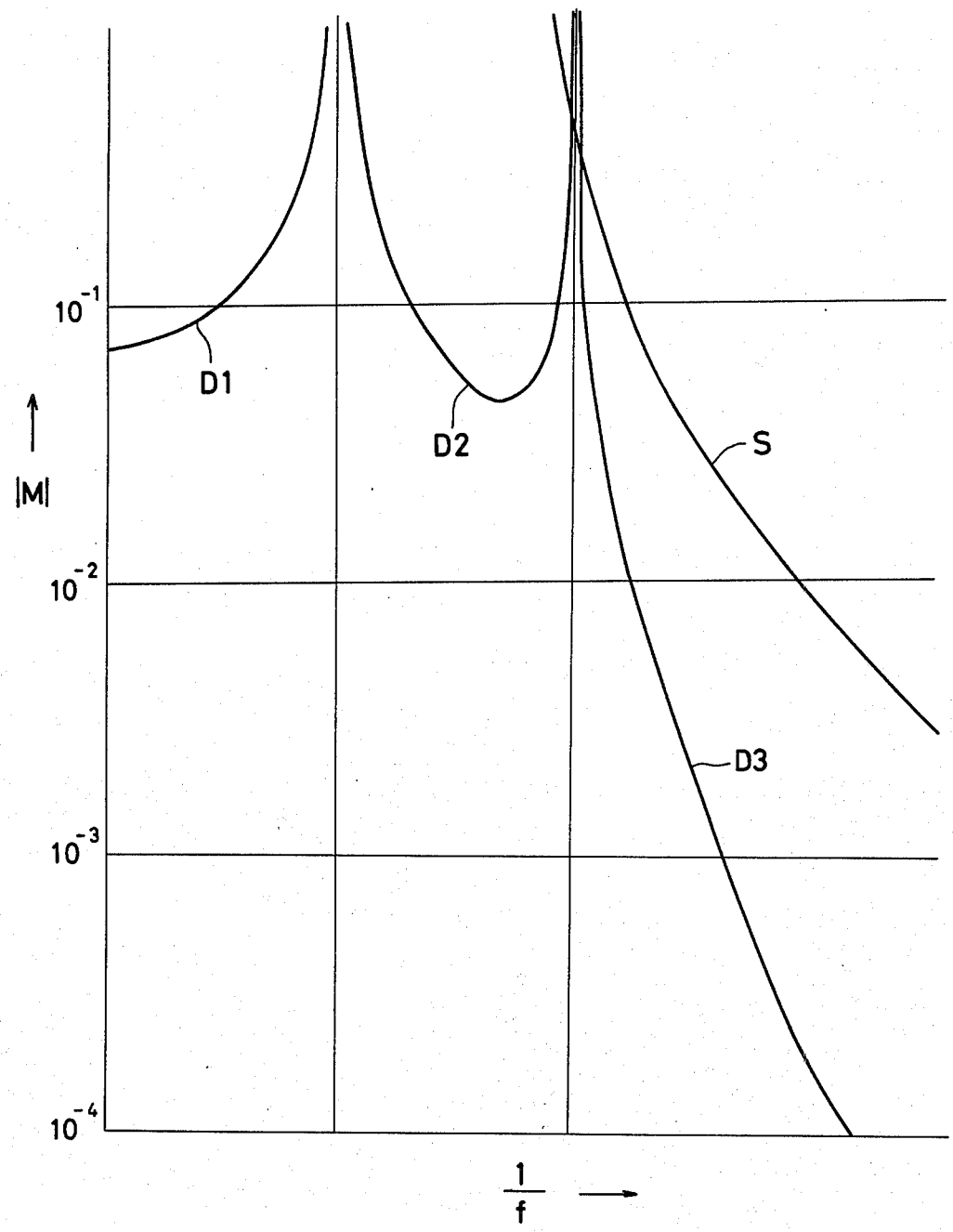
FIG. 3 shows a graph illustrative of the relation between magnifications of the illumination lens system and reciprocals of the focal lengths of the first condenser lenses of single-gap and double-gap configurations as shown in FIGS. 1 and 2.
Figure 5:
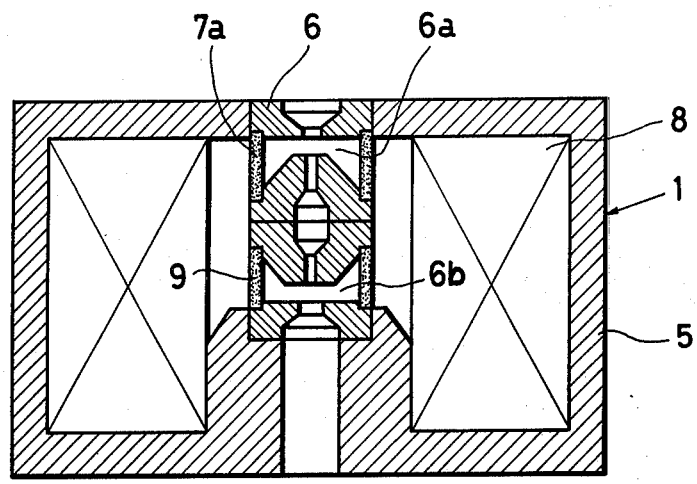
FIG. 5 illustrates a vertical cross-section of a first condenser lens according to the embodiment of the present invention.

The present invention will now be described with reference to the drawings. FIG. 5 shows a vertical cross-section of a first condenser lens according to the embodiment of the present invention. Like or corresponding parts shown in FIG. 5 are denoted by like or corresponding reference characters shown in FIG. 4. The first condenser lens 1 is of substantially the same construction as that of the first condenser lens 1 shown in FIG. 4, but differs therefrom in that the spacer 7b is replated with a ferromagnetic body 9 in the form of a hollow cylinder extending peripherally around the second gap 6b, the ferromagnetic body 9 serving as a bypass for magnetic flux. The ferromagnetic body 9 is of such a material, thickness and length that it will be magnetically saturated when strongly excited. The intensity of excitation, which causes the magnetic saturation, should preferably by at the point where the curves S and D3 (see FIG. 3) intersect, or in a region of excitation slightly stronger than that point. Where the ferromagnetic body 9 as well as the pole piece is made of iron, the ferromagnetic body 9 can be magnetically saturated by a suitable intensity of excitation, provided the thickness of the ferromagnetic body is substantially equal to or smaller than the length of the second gap 6b.

When an electron lens thus constructed is weakly excited by a small excitation current, the magnetic flux passes through the ferromagnetic bypass 9 rather than the second gap 6b toward the first gap 6a. With no magnetic flux present in the second gap 6b, the electron lens serves as a single-gap lens.

When the electron lens is more strongly excited by a greater excitation current to the point where the bypass 9 becomes magnetically saturated, the bypass 9 is rendered less permeable magnetically, allowing the magnetic flux to pass through the second gap 6b toward the first gap 6a. The electron lens now serves as a double-gap lens.

Figure 6:
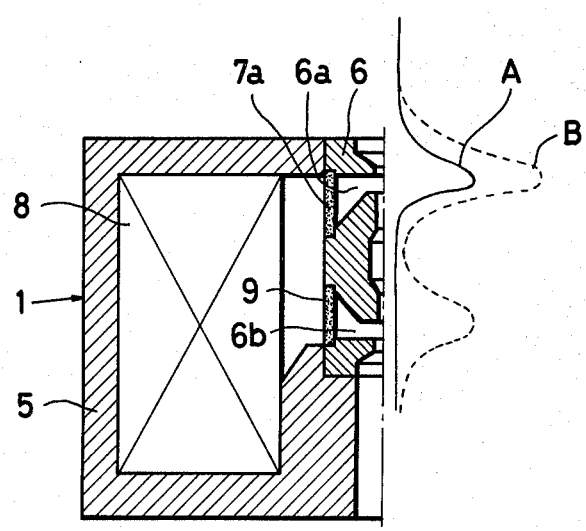
In FIG. 6 is a diagram indicative of magnetic field distribution of the lens as shown in FIG. 5.

FIG. 6 illustrates a diagram of the magnetic field distribution of the lens shown in FIG. 5. Designated at A is a curve for the magnetic field distribution, which results when the lens is weakly excited, and B is a curve for the magnetic field distribution, which results when the lens is strongly excited. A study of the curves A, B shows that the magnetic field distribution has one peak or two peaks dependent on the intensity of excitation of the lens, and hence the electron lens can be converted from a single-gap lens to a double-gap lens or vice versa.

Figure 7:
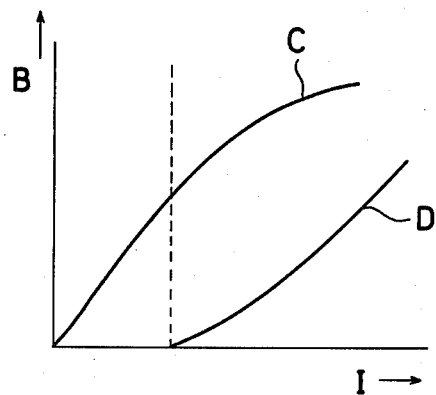
In FIG. 7 is a graph showing the relation between the intensity of a magnetic field and the excitation intensity for the lens of FIG. 5.

In FIG. 7 is a graph showing the intensity of the magnetic field (B) versus the intensity of excitation (I) of the lens illustrated in FIG. 5. The graph shows a curve C for the first gap and a curve D for the second gap. The curve D indicates that the magnetic field is generated in the second gap when the excitation reaches a certain intensity, and continuously increases in intensity in linear proportion to the excitation intensity.

Figure 1:
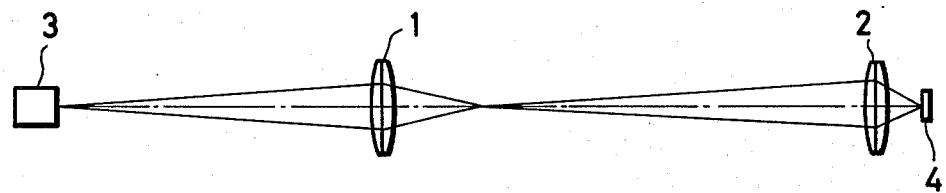
FIG. 1 shows a ray diagram for an illumination lens system which includes a first condenser lens of single-gap configuration.
Figure 2:
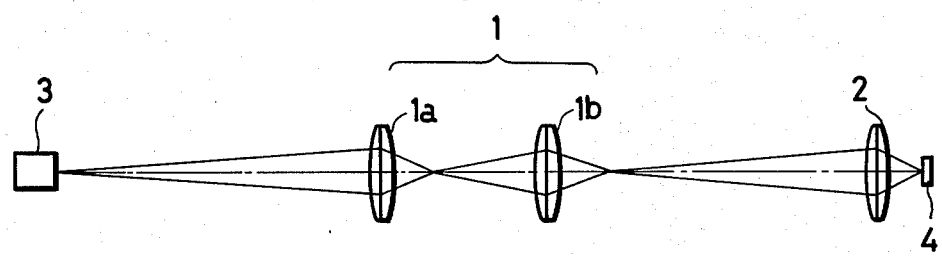
FIG. 2 shows a ray diagram for an illumination lens system which includes a first condenser lens of double-gap configuration.
Figure 8:
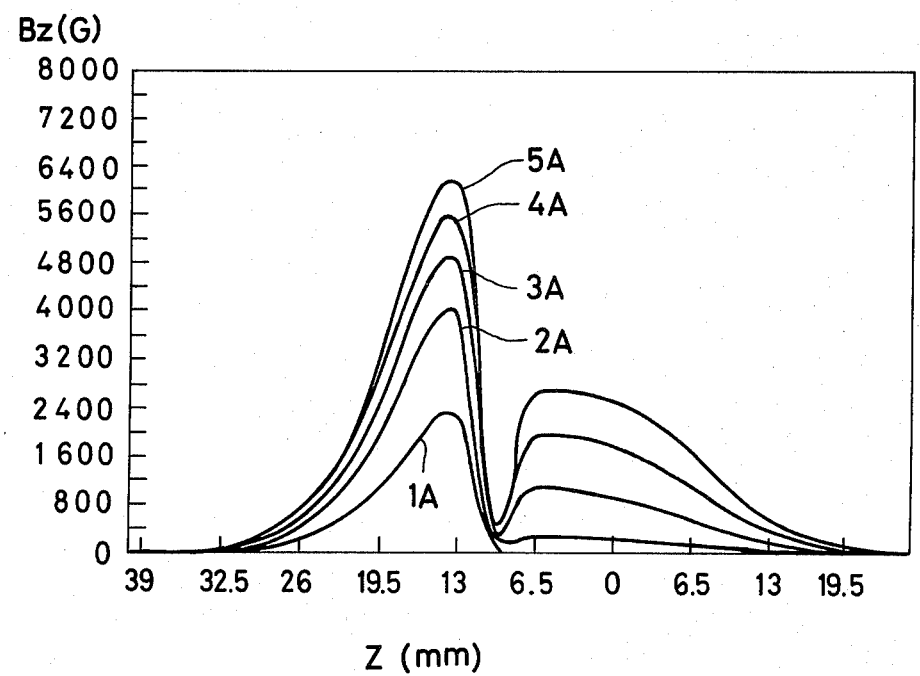
In FIG. 8 is a graph illustrative of the relation between the magnetic field intensity and the distance from the second gap in the electron lens.

FIG. 8 shows a graph of the magnetic field intensity Bz (G) with respect to the distance Z (mm) from the second gap in an electron lens in which the first gap has a length of 4 mm, the second gap has a length of 16 mm, and the bypass is defined by an iron ring extending peripherally around the second gap and having a thickness of 6 mm. The graph in FIG. 8 contains curves, which are plotted when the excitation current ranges from 1A to 5A in increments. A review of FIG. 8 shows that no magnetic field is produced in the second gap when the excitation current is 1A, a slight magnetic field is generated therein at an excitation current of 2A, and a sufficient magnetic field for producing a lens effect is produced when the excitation current is 3A or higher.

Where the electron lens is used as an illumination lens system for an electron microscope, the lens can be used selectively as a single-gap lens as shown in FIG. 1, or as a double-gap lens as shown in FIG. 2. Switching between the single-gap and double-gap lenses can be effected by changing the magnitude of the excitation current; the single-gap lens is formed when the excitation current is low, and the double-gap lens is formed when the excitation current is increased. The spot size of the electron beam can be effectively increased or reduced.

Although the ferromagnetic body 9 is described above as being made of iron, it may be made of other materials. The ferromagnetic body 9 may be rod-shaped or of another shape instead of being cylindrical. The thickness of the ferromagnetic body 9 governs the magnitude of excitation at which the magnetic field distribution changes from a single peak configuration to a double peak configuration, depending on the length of the gap in the lens and the distance between the lenses. Thus, the thickness of the ferromagnetic body 9 should be selected to meet the desired excitation requirement. The ferromagnetic body 9 should be as thin as needed to produce a magnetic field in the second gap when the excitation is strong.

The ferromagnetic body 9 may be disposed in the first gap instead of the second gap. Where the lens has three gaps or more, at least one such gap should be provided with the ferromagnetic body 9. The ferromagnetic body 9 may be disposed in lenses other than the first condenser lens.

While the electron lens, according to the present invention, has been described as being utilized to effect switching between transmission and scanning images obtained by an electron microscope, the lens can find other applications. For example, the electron lens of the invention can be used to enlarge the spot size of an electron beam in a scanning electron microscope when observing images magnified at a low magnification or when it is employed as an X-ray microanalyzer. The electron lens of the invention is also applicable to all uses in which the diameter of an electron beam needs to be adjusted.

With the present invention, as described above, conversion between single-gap and double-gap electron lenses can automatically be carried out by changing the excitation current, and thus the diameter of a beam of electrons can be adjusted.

Having thus described the invention with the detail and particularity required by the Patent Laws, what is desired protected by Letters Patent is set forth in the following claims.

We claim:

1. In a charged particle beam magnetic lens comprising a structure defining a lens axis for being aligned with the electro-optical axis of the particle beam, said structure including an annular electric coil arranged coaxially around the lens axis for producing a magnetizing force (amp-turns) when electrical current passes through the coil, a yoke structure comprising a low reluctance material surrounding the coil, said yoke having a plurality of annular lens gaps facing the lens axis such that the magnetic flux (B) resulting from the magnetizing force is substantially confined within the low reluctance pathway provided by the yoke except at the lens gaps, the improvement comprising:

a ferromagnetic shunt within at least one but not all of said annular lens gaps, said ferromagnetic shunt sized and configured to confine substantially all the magnetic flux therein and to prevent lens action in the gap so long as the magnetizing force (amp-turns) due to the exciting current flowing in the coil does not drive the shunt into magnetic saturation and said ferromagnetic shunt permitting magnetic flux inwardly of the gap to cause lens action after the magnetizing force exceeds the value that causes magnetic saturation of the shunt thus increasing the number of gaps in the lens providing lens action.

2. The magnetic lens according to claim 1 wherein the ferromagnetic shunt extends perpendicularly around the gap with which it is associated.

3. The magnetic lens according to claim 1 wherein the lens comprises two gaps with a ferromagnetic shunt in one of the gaps being the second gap through which the charged particle beam passes as it traverses the said lens.

4. The magnetic lens according to claim 1 wherein the ferromagnetic shunt comprises a hollow cylinder having its axis parallel to the axis of the lens.

5. The magnetic lens according to claim 1 wherein the ferromagnetic shunt is made of iron.

* * * * *